(12) United States Patent
Weber et al.

(10) Patent No.: US 10,139,459 B2
(45) Date of Patent: Nov. 27, 2018

(54) PASSIVE MRI-GUIDED TRACKING OF METALLIC OBJECTS USING ARTIFACT-REDUCED IMAGING WITH SELECTIVE EXCITATION

(71) Applicant: The Board of Trustees of the Leland Stanford Junior University, Palo Alto, CA (US)

(72) Inventors: Hans Weber, Menlo Park, CA (US); Brian A. Hargreaves, Menlo Park, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 140 days.

(21) Appl. No.: 15/474,510

(22) Filed: Mar. 30, 2017

(65) Prior Publication Data

US 2018/0284201 A1  Oct. 4, 2018

(51) Int. Cl.
*G01R 33/28* (2006.01)
*G01R 33/483* (2006.01)
*G01R 33/561* (2006.01)

(52) U.S. Cl.
CPC ....... *G01R 33/287* (2013.01); *G01R 33/4833* (2013.01); *G01R 33/5611* (2013.01)

(58) Field of Classification Search
CPC ............. G01R 33/287; G01R 33/4833; G01R 33/5611
See application file for complete search history.

(56) References Cited

U.S. PATENT DOCUMENTS

| | | | |
|---|---|---|---|
| 8,123,697 B2 * | 2/2012 | Daum | A61B 90/10 600/562 |
| 8,526,691 B2 | 9/2013 | Strehl | |
| 8,948,841 B2 | 2/2015 | Martel | |
| 2006/0106300 A1 | 5/2006 | Seppenwoolde | |
| 2014/0002080 A1 * | 1/2014 | Den Harder | G01R 33/445 324/309 |
| 2016/0306021 A1 | 10/2016 | Weber | |
| 2017/0371010 A1 * | 12/2017 | Shanbhag | G01R 33/243 |

* cited by examiner

*Primary Examiner* — Gregory H Curran
(74) *Attorney, Agent, or Firm* — Lumen Patent Firm

(57) ABSTRACT

A method using 2D multi-spectral imaging (2DMSI) for MRI imaging of a metallic object (such as a biopsy needle) and region surrounding the metallic object within an imaging field of view of an MRI apparatus includes segmenting the imaging field-of-view into spatial-spectral bins, where the segmenting is based on off-resonance frequency induced by the metallic object and slice location; selectively exciting each frequency bin of the spatial-spectral bins by inverting a slice selection gradient between excitation and refocusing pulses; performing repeated acquisition with different radiofrequency modulations to produce acquired images of adjacent bins; composing a 2DMSI image by root-sum-of-squares combination of the acquired images of adjacent bins; and highlighting in the 2DMSI image an area of furthest off-resonance bins based on 2DMSI off-resonance information by thresholding image intensity in frequency bins, thereby indicating a contour of the metallic object.

8 Claims, 7 Drawing Sheets

A: MRI BioGun (E-Z-EM, Westbury, NY, USA)
B: MRI Biopsy Handy (Somatex, Teltow, Germany)

C & D: Bard Mission Core Biopsy Instrument
(Bard Inc., Murray Hill, NJ, USA)

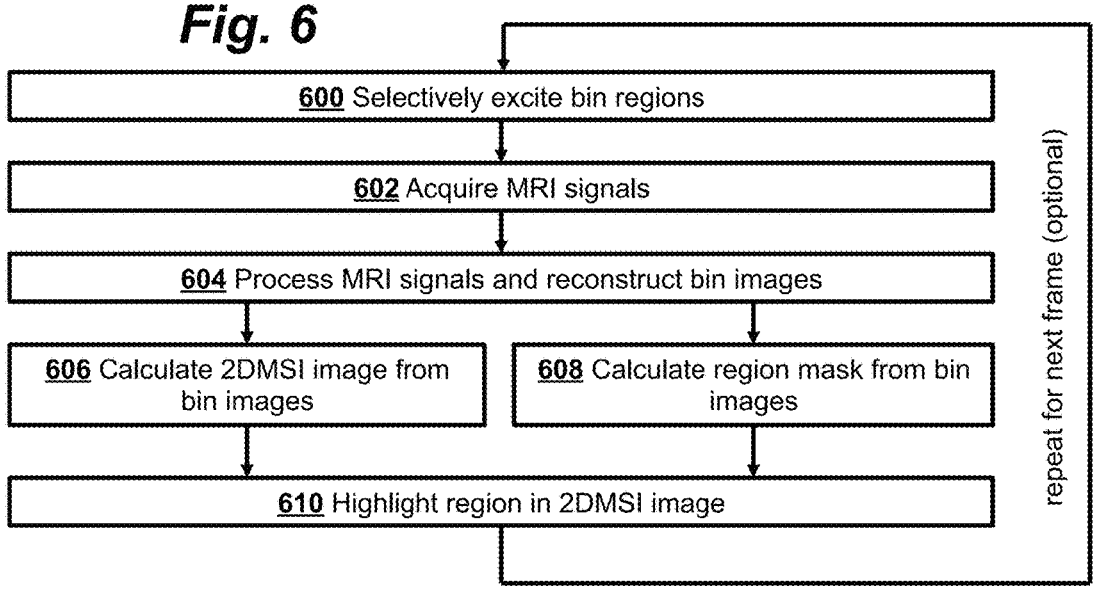
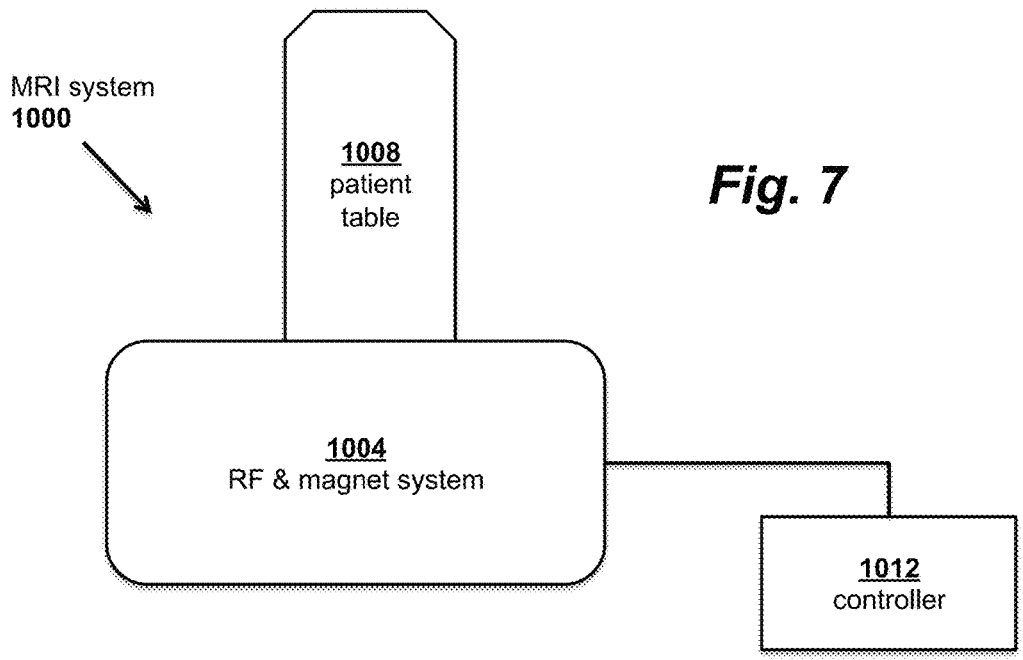

PASSIVE MRI-GUIDED TRACKING OF METALLIC OBJECTS USING ARTIFACT-REDUCED IMAGING WITH SELECTIVE EXCITATION

STATEMENT REGARDING FEDERALLY SPONSORED RESEARCH OR DEVELOPMENT

This invention was made with Government support under contract EB019723 awarded by the National Institutes of Health, and under contract AR063643 awarded by the National Institutes of Health. The Government has certain rights in the invention.

FIELD OF THE INVENTION

The present invention relates generally to MRI imaging. More specifically, it relates to techniques for tracking and reducing artifacts due to metallic objects in MRI imaging.

BACKGROUND OF THE INVENTION

MR-guidance for biopsy procedures features high intrinsic soft-tissue contrast. However, the metallic needle can induce field inhomogeneities, resulting in artifacts such as distortions or signal voids due to dephasing in gradient-recalled echo (GRE) sequences conventionally used for guidance. Though signal voids may aid in localizing the needle, this makes it challenging to pinpoint the exact needle location for reliable targeting of smaller lesions. In-plane and through-plane distortions can misguide the needle path, as lesions might appear at a different position on imaging with respect to their actual location. "MR compatible" lower susceptibility materials such as cobalt-chromium, nickel-chromium or titanium can reduce these artifacts. However, these materials are a significant compromise for biopsy, as they cannot be ground as sharply, resulting in a poor cutting performance and sample quality.

BRIEF SUMMARY OF THE INVENTION

The present invention provides techniques for MRI imaging that reduce the needle artifacts for more precise needle localization and tracking, which can enable the usage of conventional stainless-steel biopsy needles. The approach uses 2D multi-spectral imaging (2DMSI) for artifact-reduced imaging of both MR-compatible and conventional biopsy needles, using off-resonance information in the 2DMSI image to highlight and thereby track the needles.

In one aspect, the invention provides a method using 2D multi-spectral imaging (2DMSI) for MRI imaging of a metallic object (such as a biopsy needle) and region surrounding the metallic object within an imaging field of view of an MRI apparatus. The method, performed by the MRI apparatus, includes segmenting the imaging field-of-view into spatial-spectral bins, where the segmenting is based on off-resonance frequency induced by the metallic object and the slice location; selectively exciting each spatial-spectral bin by inverting a slice selection gradient between excitation and refocusing pulses; performing repeated acquisition with different radiofrequency modulations to produce acquired images of adjacent frequency bins; composing a 2DMSI image combination of the acquired images of adjacent bins (e.g., by root-mean-squares); and highlighting in the 2DMSI image an area of off-resonance bins, wherein the area is determined from 2DMSI off-resonance information by thresholding image intensity in frequency bins, thereby indicating a contour of the metallic object. In this context, "off-resonance" bins are defined to include bins with maximal magnitude (positive and/or negative) off-resonance frequency, and possibly near-maximal magnitude bins, within a predetermined threshold fraction of maximal. The method may be continuously repeated to acquire a series of 2DMSI images. Parallel imaging may be used to accelerate the data acquisition.

The highlighting in the 2DMSI image may include color-coding the image area based on the sign of the off-resonance frequency of the bins used for highlighting. The method may also include changing a contrast of the 2DMSI image by selectively inverting each bin with an inversion pulse or other preparation methods.

In some implementations, only a subset of bins is acquired. The subset of bins may include the on-resonant bin and the off-resonance bins with highest off-resonance frequency (e.g., within a predetermined threshold of maximal). The subset of bins may include only the off-resonance bins with highest off-resonance frequency, where the information is used to highlight the corresponding image areas in a conventionally acquired MRI image.

BRIEF DESCRIPTION OF THE SEVERAL VIEWS OF THE DRAWINGS

FIG. 6. is a flow chart of a 2DMSI technique for imaging and highlighting of a metal object, according to embodiments of the present invention.

FIG. 7 is a schematic top view of a magnetic resonance imaging (MRI) system that may be used to implement a 2DMSI technique according to embodiments of the invention.

DETAILED DESCRIPTION OF THE INVENTION

2DMSI enables imaging in the presence of strong field inhomogeneities by segmenting the slice into spectral regions ("bins") that can be imaged with minimal artifact. In embodiments of the invention, we use 2DMSI techniques to both virtually remove the artifacts for MR compatible needles and to reduce the artifacts for a conventional stainless steel needle to an acceptable level. The 2DMSI-intrinsic off-resonance information can also be used for tracking of the needle. The techniques of 2DMSI are described in US20160306021, which is incorporated by reference. It discloses a method performed by a magnetic resonance imaging (MRI) system for imaging close to a metal object, and correcting for artifacts induced by the metal object.

Figure 1:
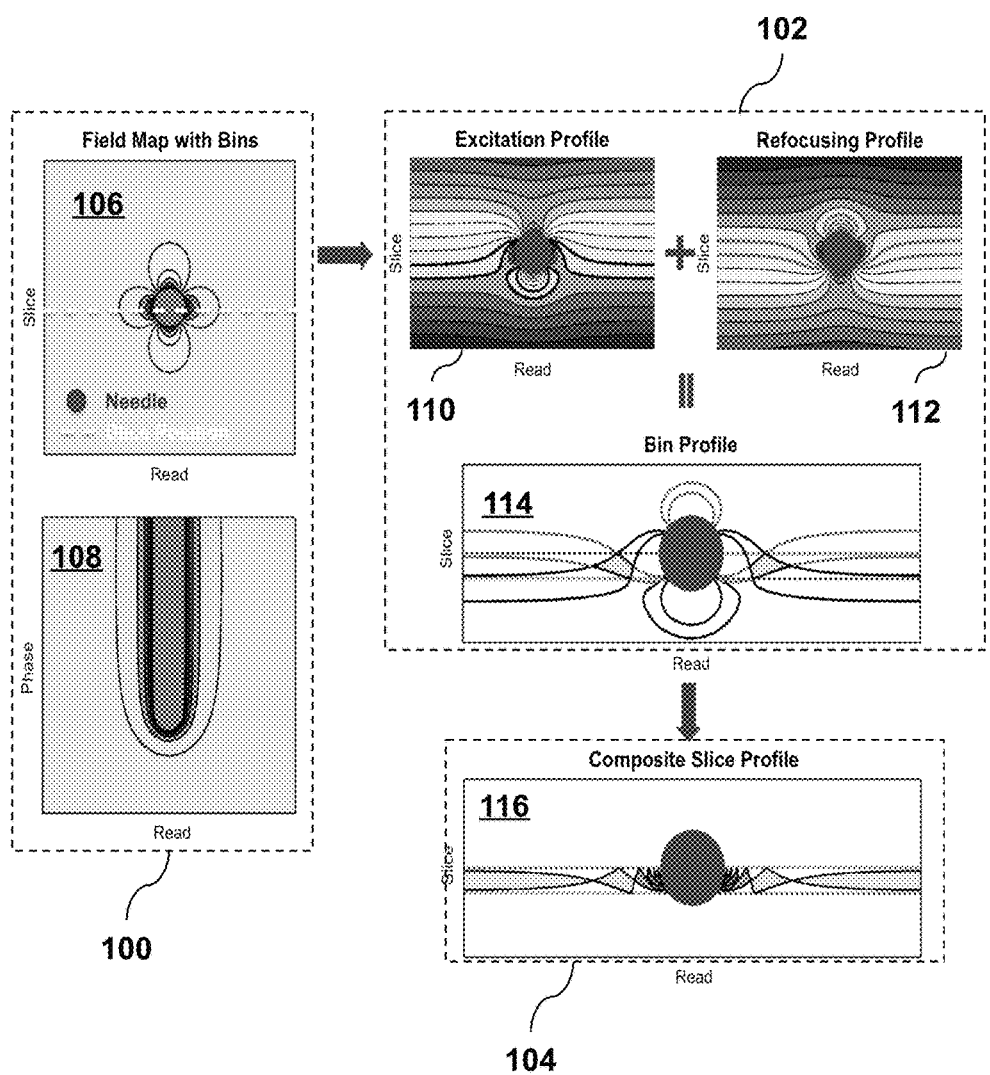
FIG. 1 illustrates a conventional 2DMSI technique.

FIG. 1 illustrates a 2DMSI technique which may be adapted for use in embodiments of the present invention. In step 100 the slice is segmented into spatial-spectral regions ("bins") that can be imaged with minimal artifact. A field map with bins in the slice-read plane is shown as 106, and the corresponding field map with bins in the phase-read plane at the slice position is shown as 108. In step 102, for bin selection, the slice selection gradient is inverted between excitation profile 110 and refocusing profile 112 pulses. The bin profile is shown as 114. As this bin contains the on-resonant frequency conventionally used for imaging of this slice, it is called the on-resonant bin. Repetition of the acquisition with different radiofrequency (RF) modulations results in imaging of adjacent, off-resonance bins. In step 104, the final 2DMSI image 116 is built up by root-mean-squares combination of the individual bin images. By increasing the number of frequency bins, visualization of the region close to the metal increases. For single-shot 2DMSI, the acquisition time scales linearly with both the number of bins and slices.

The technique used in 2DMSI to selectively excite both a limited slice and limited (but large) bandwidth ("bin") is a simple gradient-reversal technique. The slice-selection gradient polarity is inverted during the excitation RF pulse with respect to that of all refocusing RF pulses, so that only spins experiencing both excitation and refocusing produce signal. This approach has been used previously for fat suppression, and to suppress off-resonance signal near metal to increase needle conspicuity and/or to reduce artifacts. For the i-th slice at location $z_i$ and j-th resonance offset ($\Delta f_j$), excitation and refocusing pulse modulation frequencies $f_{i,j}$ and $f'_{i,j}$ respectively are calculated simply as $f_{i,j} = \gamma/2\pi G_z z_i + \Delta f_j$ and $f'_{i,j} = -\gamma/2\pi G_z z_i$ where $G_z$ is the selection gradient amplitude for excitation and $\gamma$ is the gyromagnetic ratio. The receive frequency can be set to $\Delta f_j$ for fast image combination.

For 2DMSI, a single-shot fast-spin-echo (FSE) pulse sequence with variable refocusing angles may be used. Typically, the RF pulses for excitation and refocusing are identical, but scaled for different flip angles. Typically, 480 µs sinc-like Shinnar-Le Roux pulses with approximately 1.2 kHz bandwidth at half-maximum, aimed at minimizing echo spacing are used. Frequency bands ($\Delta f_j$) are typically spaced 900 Hz apart, and scanned in an odd-then-even order to reduce saturation effects between adjacent bins. Acquisitions typically use high receive bandwidth of ±125 kHz (651 Hz/pixel), to limit in-plane distortion to within about ±0.7 pixels, and half-Fourier phase encoding to reduce echo-train blurring compared with center-out phase encoding. Acquired data are demodulated during acquisition by the frequencies $\Delta f_j$ and images reconstructed for each bin. The bin images may be combined using a root-mean-square approach or complex sum, with the root-mean-square approach generally improving SNR at a cost of minor shading.

According to embodiments of the present invention, the conventional 2DMSI technique is adapted and supplemented to provide imaging and highlighting of a metal object. A flow chart of the technique is shown in FIG. 6. In step 600 bin regions are selectively excited. MRI signals are then acquired in step 602. In step 604 the acquired signals are processed to reconstruct bin images. 2DMSI image is calculated from the bin images in step 606. In addition, a region mask is calculated from bin images in step 608. In step 610 a region in the 2DMSI image defined by the region mask is highlighted, indicating the location of the metal object. The steps may be repeated to acquire a series of 2DMSI images. Specifically, for each bin image, the image intensity is normalized on the maximum image intensity. For each bin image, a bin region mask is created by selecting voxels over a given intensity threshold. Usually, the bin region mask of the bins with highest positive and negative off-resonance frequency are combined to form the region mask describing the area to be highlighted. However, to increase the highlighted area, bin region masks of adjacent off-resonance bins may be added to the region mask. For highlighting, for instance, the region mask can be used to color code the image intensity in the 2DMSI image or as an overlay on the image. The highlighted area may be additionally color coded based on the sign of the frequency of the bins contributing to the mask, i.e., positive off-resonance or negative off-resonance.

An apparatus that may be used to implement such a 2DMSI techniques is shown in FIG. 7, which is a schematic top view of a magnetic resonance imaging (MRI) system 1000. The MRI system 1000 includes an RF and magnet system 1004, a patient table 1008 connected to the magnet system, and a controller 1012 controllably connected to the magnet system. In operation, a patient on the patient table 1008 is positioned with a region to be measured within the magnet system 1004. The controller 1012 controls magnetic fields and radio frequency (RF) signals generated by the magnet system 1004 and receives signals from detectors in the magnet system 1004. The controller 1012 includes a computer system with a processor, display, memory, storage, user interface devices, and communications interface. A non-transient computer readable medium may include computer readable instructions that are executed by the computer to perform the steps of the technique described herein.

Figure 2A:
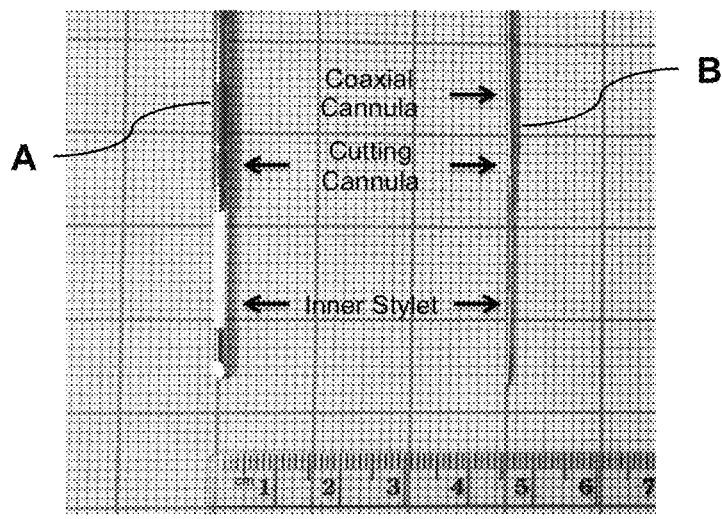
FIGS. 2A-B show details of biopsy needles used in illustrative scans using techniques of embodiments of the present invention.
Figure 2B:
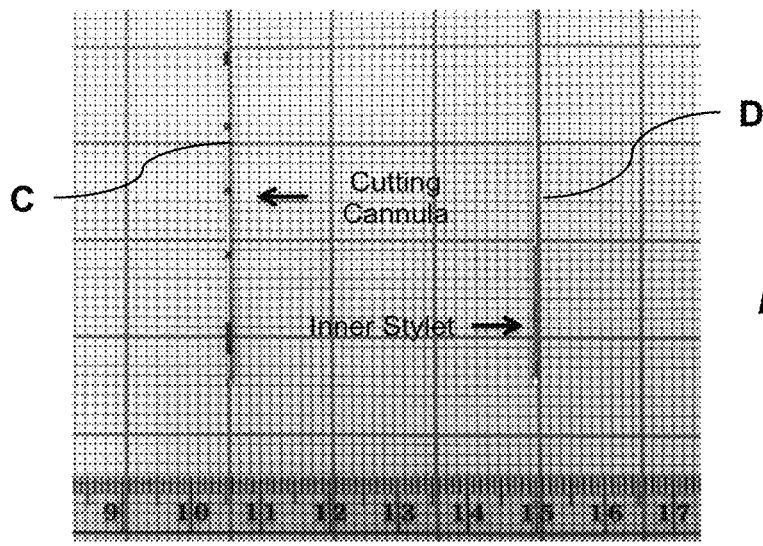

To illustrate the techniques of the present invention, imaging experiments will now be described. The experiments were performed on a 3T MRI apparatus using a six channel surface coil. Biopsy needles were mounted in a rectangular plastic grid and immersed in water. All needles were oriented perpendicular to the static magnetic field to maximize artifact. FIGS. 2A-B show details of the biopsy needles. Needle A had a 14 G cutting cannula and an inner stylet (both nickel-chromium). Needle B had a 16 G coaxial cannula, a 18 G cutting cannula and an inner stylet (all cobalt-chromium). For both needles, the inner stylet exceeds the tip of the cannula for about 25 mm. Needle C was a 20 G cutting cannula and needle D the corresponding inner stylet (both 304 stainless steel). The grid size shown in the figures is similar to the phantom, and the needle position relative to the grid is comparable to the position in the phantom.

Figures 3A, 3B, 3C, 3D, 3E, 3F, 3G, 3H:
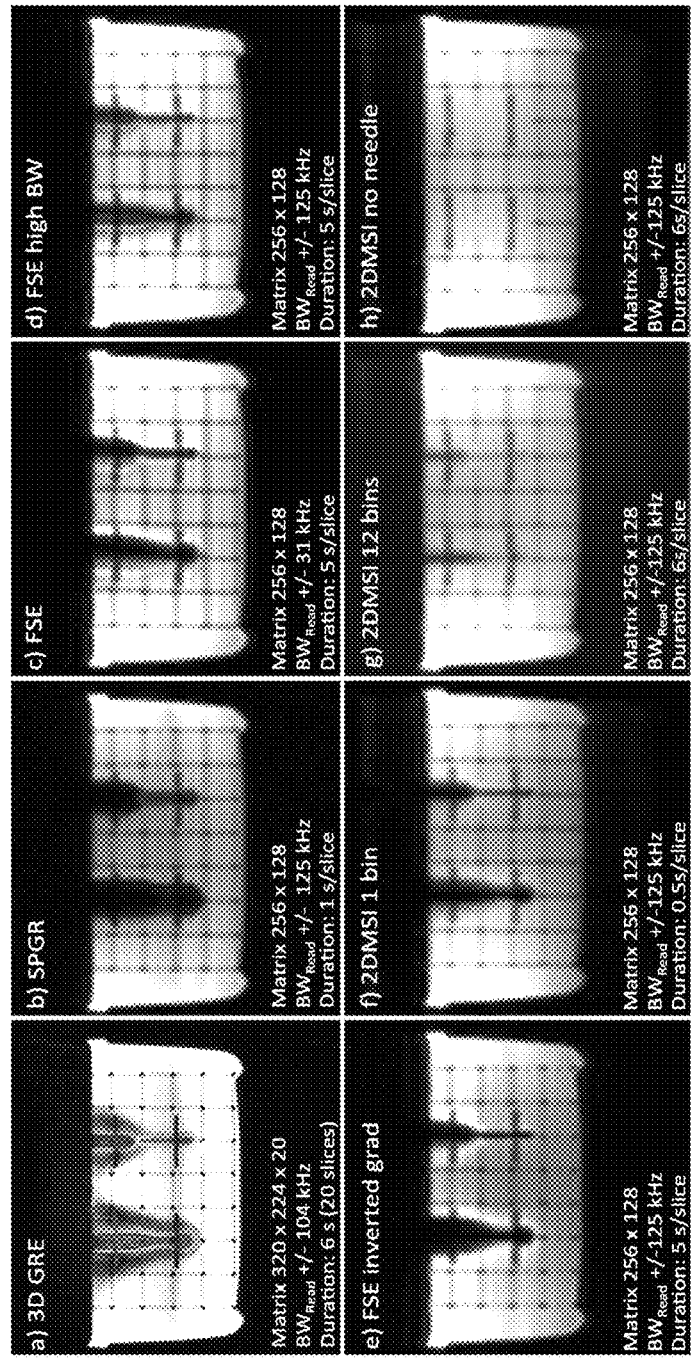
FIGS. 3A-H show axial images acquired with single-shot 2DMSI, fast-spin-echo (FSE), spoiled-gradient-recalled-echo (SPGR) and 3D gradient-echo (3D GRE) which compare conventional imaging with alternative artifact reduction techniques according to embodiments of the present invention.
Figures 4A, 4B, 4C, 4D, 4E, 4F, 4G, 4H:
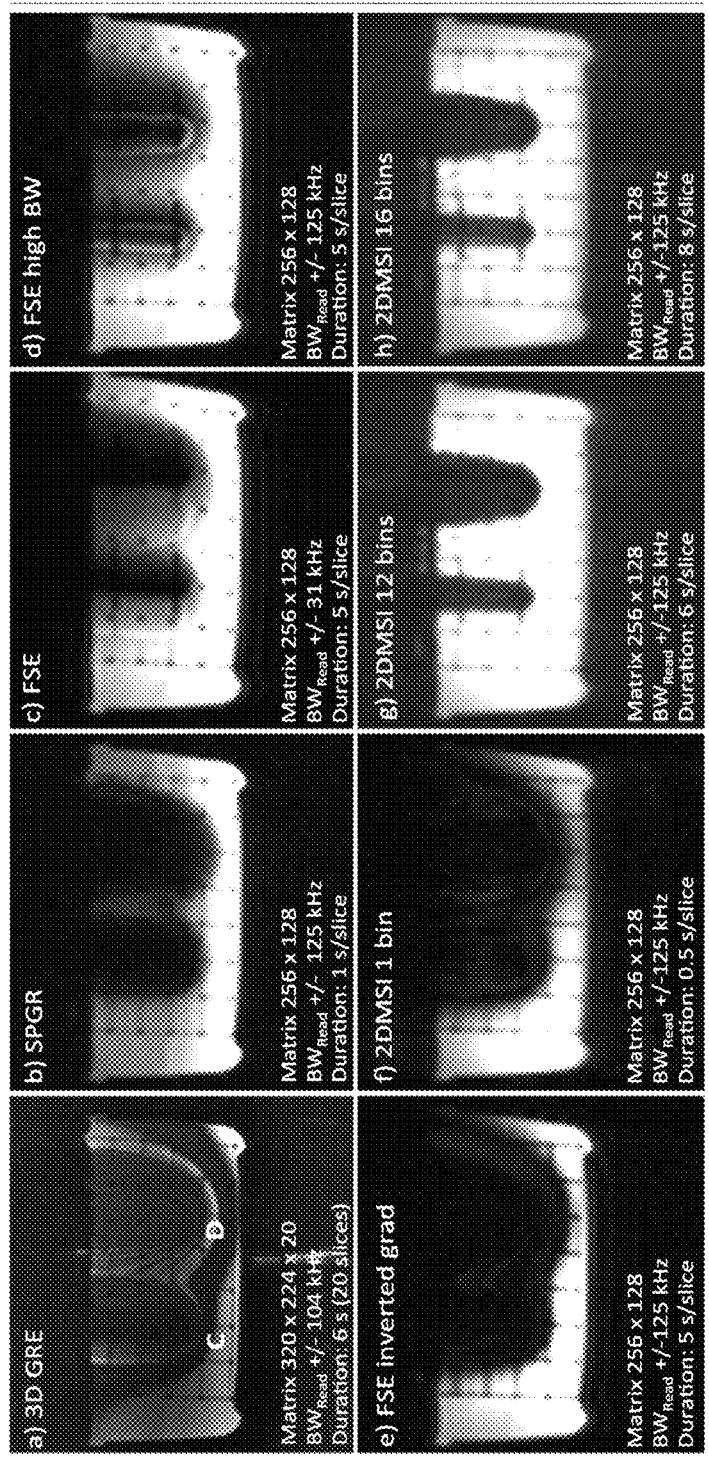
FIGS. 4A-H show images for the components of the stainless steel needle. Compared to the reference methods, 2DMSI strongly increases coverage close to the needles.

To compare with conventional imaging and alternative artifact reduction techniques, axial images were acquired with single-shot 2DMSI, fast-spin-echo (FSE), spoiled-gradient-recalled-echo (SPGR) and 3D gradient-echo (3D GRE). Sequence-specific details are listed in FIGS. 3A-H. FSE imaging was repeated with increased readout bandwidth and inverted slice selection gradient. 2DMSI images were acquired with 1 bin (covering off-resonances from −0.5 kHz to 0.5 kHz) 12 bins (−4.5 kHz to 5.4 kHz) and 16 bins (−6.3 kHz to 7.2 kHz, stainless-steel needle only). The figures show axial slice containing both MR-compatible biopsy needles, comparing conventional imaging (FIGS. 3A-B), alternative artifact reduction techniques (FIGS. 3C-E) and 2DMSI (FIGS. 3F-G). Frame (FIG. 3H) shows the grid phantom without needles as a reference. All images were acquired with FOV 34 cm (cropped), 4 mm slice thickness and the readout oriented in left-right. Whereas the reference techniques suffer from signal void and distortions, 2DMSI with 12 bins also enables artifact-reduced visualization of the off-resonance regions close to the needles and thus more precise needle localization.

For needle tracking, a series of axial 2DMSI images with 12 bins were acquired of the MR-compatible biopsy needles located at different positions within the grid and with different orientations. The regions of the off-resonance bins with the three highest and three lowest frequencies, respectively were highlighted using color-coding of the 2DMSI images intensity. The color coding also took into account the sign of the off-resonance frequency. The bin regions were determined from the signal intensity within the individual bin images by thresholding using a 60% threshold.

FIGS. 3A-H show the imaging results for the MR-compatible needles. With all sequences, the needles are visible although the ability to pinpoint them varies strongly. Although the 3D GRE image (FIG. 3A) produces an easily visible needle axis, hypo- and hyper-intense signals surround the needle. Despite a comparable short TE of 1.9 ms, the SPGR image (FIG. 3B) is dominated by signal void, limiting the ability to pinpoint the needle. In comparison, the FSE image (FIG. 3C) compensates for signal void, revealing the distortions visible as hypo- and hyper-intense bands surrounding the needle. Increasing the readout bandwidth (FIG. 3D) reduces the in-plane distortions and the through-plane distortions become more distinct. Inverting gradients (FIG. 3E) successfully suppresses the signal from the off-resonance regions, which would result in distortions, thus identifying the unbiased signal. Single-bin 2DMSI (FIG. 3F) reveals a similar result, although higher-bandwidth RF-pulses cause a better region selection. Adding off-resonance bins (FIG. 3G) reveals the regions close to both needles without distortions. Adjusting the number of bins therefore allows for choosing the coverage around the needle as a tradeoff between needle conspicuity and ability to pinpoint its location.

FIGS. 4A-H show the results for the components of the stainless steel needle. For 3D GRE (FIG. 4A) and SPGRE (FIG. 4B), both the cutting cannula (FIG. 4C, left) and the corresponding stylet (FIG. 4D) cause massive signal void. Conventional FSE imaging (FIG. 4C) and FSE imaging with high BW (FIG. 4D) reduces the signal void but yields strong distortions. Both FSE with inverted gradient (FIG. 4E) and 2DMSI with the on-resonant bin only (FIG. 4F) successfully suppresses the signal from the distorted off-resonance regions. Compared to the reference methods, 2DMSI with off-resonance bins (FIG. 4G-H) strongly increases coverage close to the needles. In particular for the cannula (left), relevant for the cutting performance, the extent of the artifacts is comparable to the one for MR compatible needles with conventional imaging. Whereas massive signal void dominates the reference techniques, 2DMSI with 12 bins reduces the artifact to an extent comparable to conventional imaging of MR-compatible needles. Increasing the number of bins (FIG. 4H) achieves further artifact reduction, although the increasing steepness of the needle-induced off-resonances reduces the efficiency of this approach. Combination of the stainless steel cutting cannula with a lower susceptibility inner stylet is expected to limit the artifact of the entire biopsy system to that of the cannula.

Figure 5A:
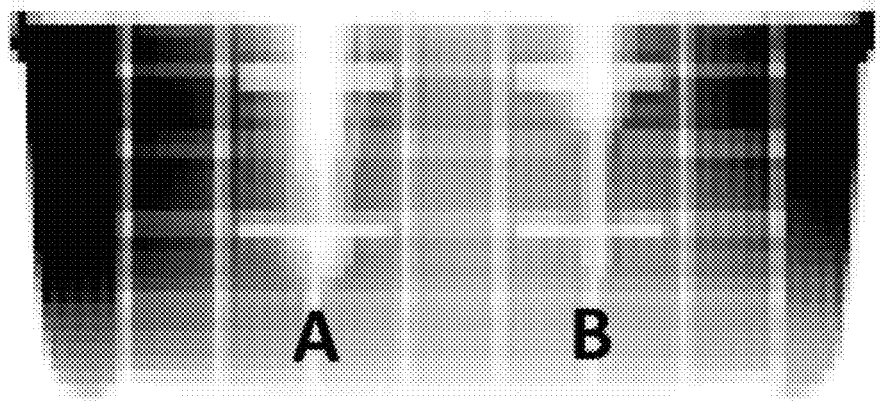
FIGS. 5A-C illustrate the tracking of the MR compatible needles using the 2DMSI-intrinsic bin off-resonance information, according to techniques of the present invention.
Figure 5B:
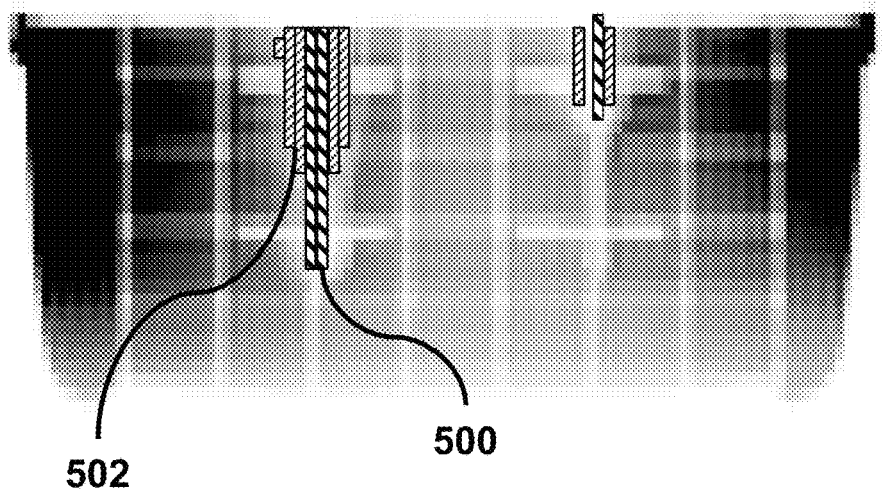
Figure 5C:
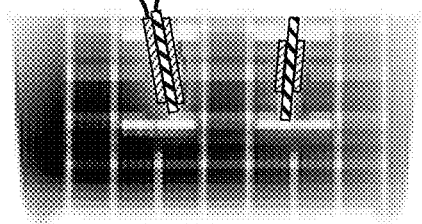
Figure 5C:
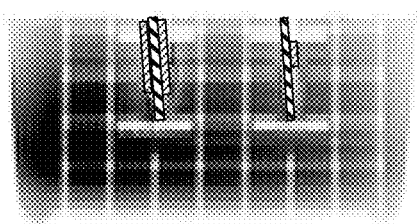
Figure 5C:
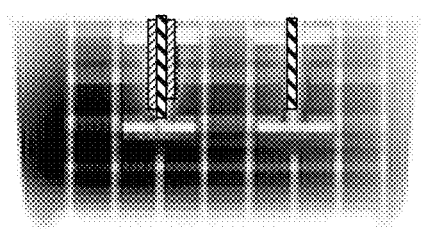
Figure 5C:
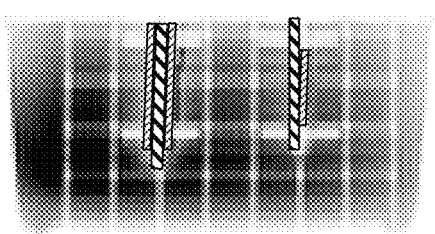
Figure 5C:
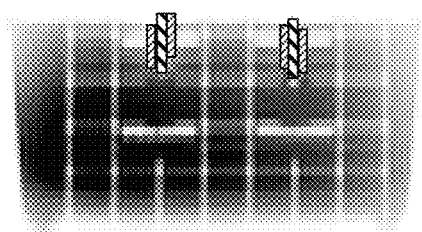
Figure 5C:
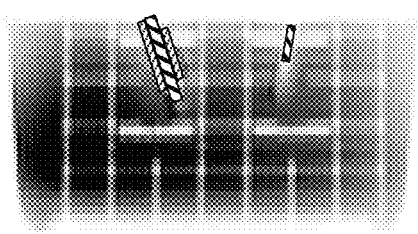
Figure 5C:
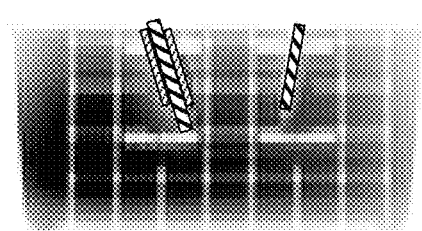
Figure 5C:
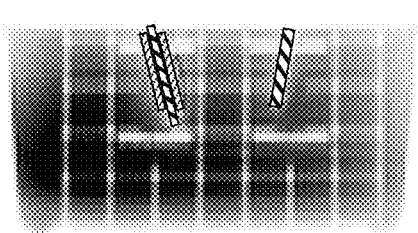

FIGS. 5A-C illustrate the tracking of the MR compatible needles using the 2DMSI-intrinsic bin off-resonance information, according to techniques of the present invention. FIG. 5A shows a conventional 2DMSI image ("raw 2DMSI image") acquired with 12 bins without highlighting of the off-resonance regions. FIG. 5B shows the same image but with the region of the three bins 500 with highest positive off-resonance frequency (2.7 kHz to 5.4 kHz) and the three bins 502 with the highest negative off-resonance frequency (−4.5 kHz to −2.7 kHz), respectively, highlighted. The mask 502 indicates signal intensity in the negative off-resonance bins, the mask 500 in the positive off-resonance bins, respectively. Compared to the raw 2DMSI image, the masking overcomes windowing issues and localizes the needle even more precisely. FIG. 5C shows a series of tracking 2DMSI images acquired during the insertion of the needles in the phantom (inner stylet retracted). The ratio of positive and negative off-resonance bin signal is also sensitive to the orientation of the needle with respect to the slice plane. The highlighting regions 502 and 500 mark the signal provided by the negative and positive off-resonance bins, respectively. Signal in the tip of the left needle is due to partial volume effects. Moving of the needle out the imaging plane would change the ratio between positive and negative off-resonances.

2DMSI techniques of the present invention provide both artifact-reduced imaging of biopsy needles for a more precise needle localization and needle tracking as well as better depiction of surrounding tissue. These 2DMSI techniques can be especially useful for biopsy needles inducing large distortions or for targeting of small lesions. In addition, the present invention may enable use of a wider range of needle materials, with potentially better sampling performance.

The invention claimed is:

1. A method using 2D multi-spectral imaging (2DMSI) for MRI imaging of a metallic object and region surrounding the metallic object within an imaging field of view of an MRI apparatus, the method comprising:
   segmenting the imaging field-of-view into spatial-spectral bins, where the segmenting is based on off-resonance frequency induced by the metallic object and the slice location;
   selectively exciting each spatial-spectral bin by inverting a slice selection gradient between excitation and refocusing pulses;
   performing repeated acquisition with different radiofrequency modulations to produce acquired images of adjacent frequency bins;
   composing a 2DMSI image by combination of the acquired images of adjacent bins;
   highlighting in the 2DMSI image an area of off-resonance bins based on 2DMSI off-resonance information by thresholding image intensity in frequency bins, thereby indicating a contour of the metallic object.

2. The method of claim 1 wherein highlighting in the 2DMSI image comprises color-coding the image area based on the sign of the off-resonance frequency of the bin.

3. The method of claim 1 wherein the method is continuously repeated to acquire a series of 2DMSI images.

4. The method of claim 1 further comprising changing a contrast of the 2DMSI image by selectively inverting each bin with an inversion pulse.

5. The method of claim 1 wherein only a subset of bins is acquired.

6. The method of claim 5 wherein the subset of bins comprises the on-resonant bin and the furthest off-resonance bins.

7. The method of claim 5 wherein the subset of bins comprises only the furthest off-resonance bins and where the information is used to highlight the corresponding image areas in a conventionally acquired MRI image.

8. The method of claim 1 wherein parallel imaging is used to accelerate the data acquisition.

* * * * *